United States Patent
Park et al.

(10) Patent No.: US 7,362,246 B2
(45) Date of Patent: Apr. 22, 2008

(54) HIGH SPEED COMPARATOR OFFSET CORRECTION

(75) Inventors: Sunghyun Park, Ann Arbor, MI (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/518,105

(22) Filed: Sep. 8, 2006

(65) Prior Publication Data

US 2008/0062032 A1 Mar. 13, 2008

(51) Int. Cl.
*H03M 1/06* (2006.01)
(52) U.S. Cl. ...................... 341/118; 341/155
(58) Field of Classification Search ............. 341/118, 341/120, 155
See application file for complete search history.

(56) References Cited

U.S. PATENT DOCUMENTS

| | | | | | |
|---|---|---|---|---|---|
| 5,585,796 | A | * | 12/1996 | Svensson et al. | 341/155 |
| 5,631,648 | A | * | 5/1997 | Yamada et al. | 341/138 |
| 5,774,004 | A | * | 6/1998 | Peng | 327/205 |
| 6,307,200 | B1 | * | 10/2001 | Kuhnly et al. | 250/338.1 |
| 6,946,905 | B2 | * | 9/2005 | Kokubun et al. | 330/9 |
| 6,982,706 | B1 | * | 1/2006 | Doi et al. | 345/206 |
| 7,164,375 | B2 | * | 1/2007 | Sawada | 341/143 |

* cited by examiner

*Primary Examiner*—Peguy JeanPierre
(74) *Attorney, Agent, or Firm*—Dana B. Lemoine; Lemoine Patent Services, PLLC

(57) ABSTRACT

An offset canceling buffer receives a reference voltage, and provides a modified reference voltage to a comparator. The modified reference voltage operates to cancel any comparator offset. The offset canceling buffer includes a digitally controllable current source to steer current in different paths based on comparator offset.

20 Claims, 7 Drawing Sheets

HIGH SPEED COMPARATOR OFFSET CORRECTION

FIELD

The present invention relates generally to electronic circuits, and more specifically to comparator circuits.

BACKGROUND

Multi-gigasample per second (GS/s) analog-to-digital converters (ADC) are typically used in high-speed measurement systems, multi-gigabit per second (Gbit/s) wired communication receivers, wideband wireless receivers (e.g., ultra-wideband (UWB)), and other high speed systems. Time-interleaving of ADCs can extend the overall sampling rate, but time-interleaving requires precisely spaced, multi-phase clock signals and accurate matching of ADC gain, offset and delay. Circuit techniques that increase the sampling rate of a single ADC for a given power consumption can allow a single ADC to operate in environments that previously used more complicated time-interleaving.

DESCRIPTION OF EMBODIMENTS

Figure 1:
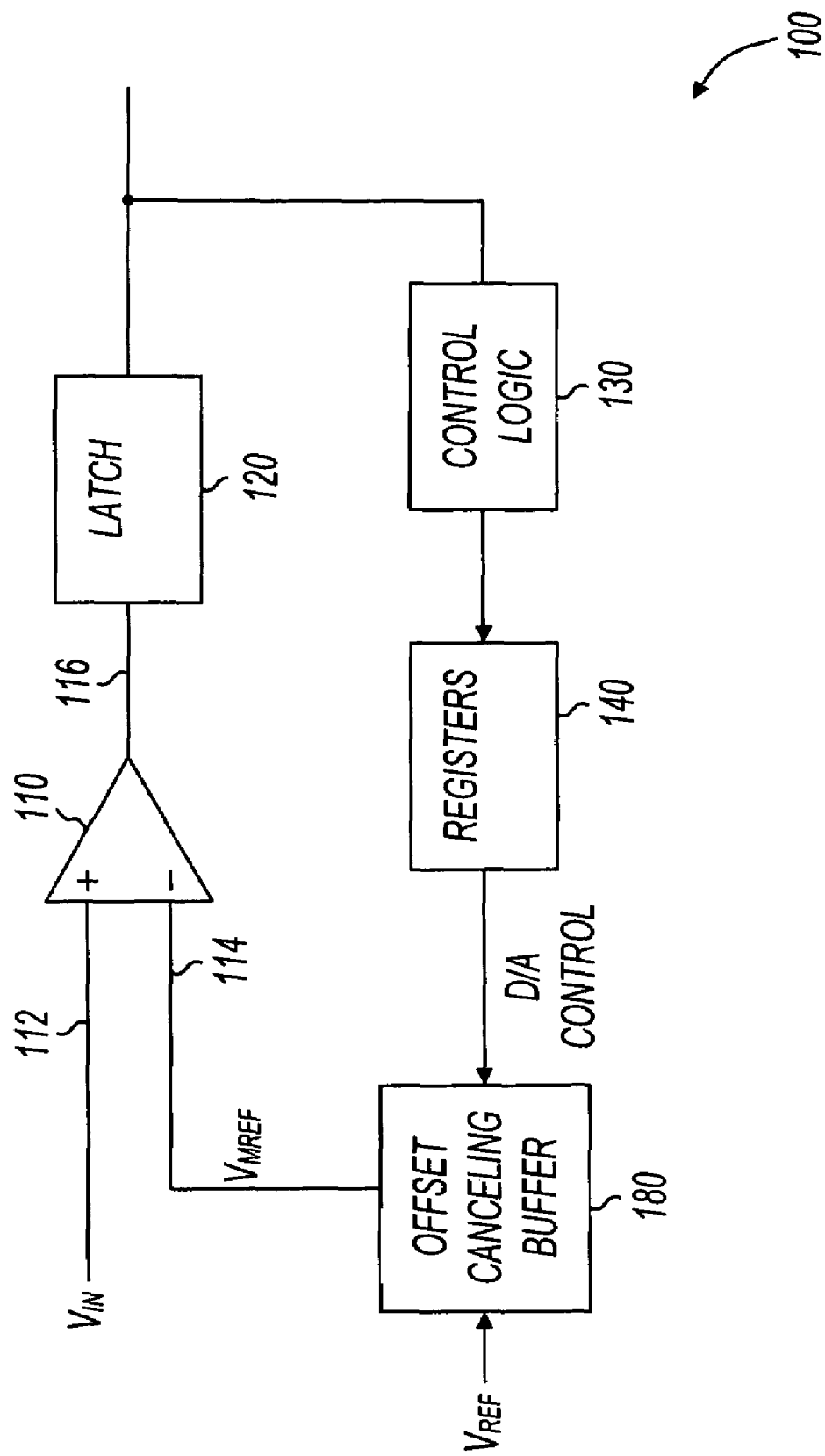
FIG. 1 shows a comparator circuit with offset cancellation.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a comparator circuit with offset cancellation. Comparator circuit 100 includes analog comparator 110, latch 120, control logic 130, registers 140, and offset canceling buffer 180. Analog comparator 110 operates to compare voltages present on input nodes 112 and 114, and to produce a digital output signal on output node 116. An ideal comparator will switch its output when the input nodes have equal voltages or very near equal voltages. In actual practice, however, comparator 110 may switch its output when the input nodes differ in voltage by an "offset." The offset may be due to many factors, including parasitic capacitance values, input transistor mismatch, process or temperature variations, or the like.

Offset canceling buffer 180 works to counteract any offset in comparator 110. In operation, offset canceling buffer 180 receives a reference voltage $V_{REF}$, and provides a modified reference voltage $V_{MREF}$ to input node 114 of comparator 110. Comparator 110 compares $V_{IN}$ with $V_{MREF}$, and latch 120 latches a digital result. For example, if $V_{IN}$ is larger than $V_{MREF}$, latch 120 may latch a digital "1," and if $V_{IN}$ is not larger than $V_{MREF}$, latch 120 may latch a digital "0."

Offset canceling buffer 180 generates $V_{MREF}$ as a modified version of $V_{REF}$ in response to a digital word received from registers 140. The modification is close to the comparator offset in magnitude but has an opposite polarity. Offset canceling buffer 180 also buffers kickback noise from the comparator so that the noise does not corrupt $V_{REF}$, which may be provided as a reference to other comparators.

Control logic 130 operates to calibrate comparator circuit 100 to reduce offset. For example, control logic 130 and registers 140 form a feedback circuit capable of determining an offset for offset canceling buffer 180 in response to the switching output of latch 120. In some embodiments, comparator circuit 100 is calibrated each time power is applied, and in other embodiments, comparator circuit 100 is calibrated on a periodic basis.

When calibration starts, $V_{IN}$ and $V_{REF}$ are set to zero. Under these circumstances, the digital output of comparator 110 is determined only by the comparator offset and any inherent offset within buffer 180. Control logic 130 causes $V_{MREF}$ to step through a series of offset voltage values by modifying the digital control word provided to offset canceling buffer 180. When the comparator output changes, control logic 130 stores the current digital control word in registers 140. During normal operation, offset canceling buffer 180 applies the corresponding offset to $V_{REF}$ when generating $V_{MREF}$, and this compensates for offset of comparator 110 and any inherent offset of buffer 180. Calibration may be performed slow or fast. For example, the calibration may be provided very slowly, while allowing all signal nodes to settle to their final voltage values. Also for example, the calibration may be performed at speeds approaching or equaling the operational speed of comparator circuit 100. Comparator circuit 110 may be clocked at the full operational speed while offset canceling buffer 180 may be clocked more slowly to ensure adequate settling time. When calibration is performed fast, dynamic effects of the circuit are also compensated.

Comparator circuit 100 is shown receiving a single-ended input voltage and a single-ended reference voltage, and producing a single-ended output, although this is not a limitation of the present invention. For example, the input voltage, reference voltage, and output voltage may be differential. As shown in FIG. 1, offset correction is provided in the reference path as opposed to the signal path. The reference path is slower than the signal path, and the addition of the offset canceling buffer does not impact signal performance. For example, in some embodiments, the reference path may have substantially constant voltages.

Figure 2:
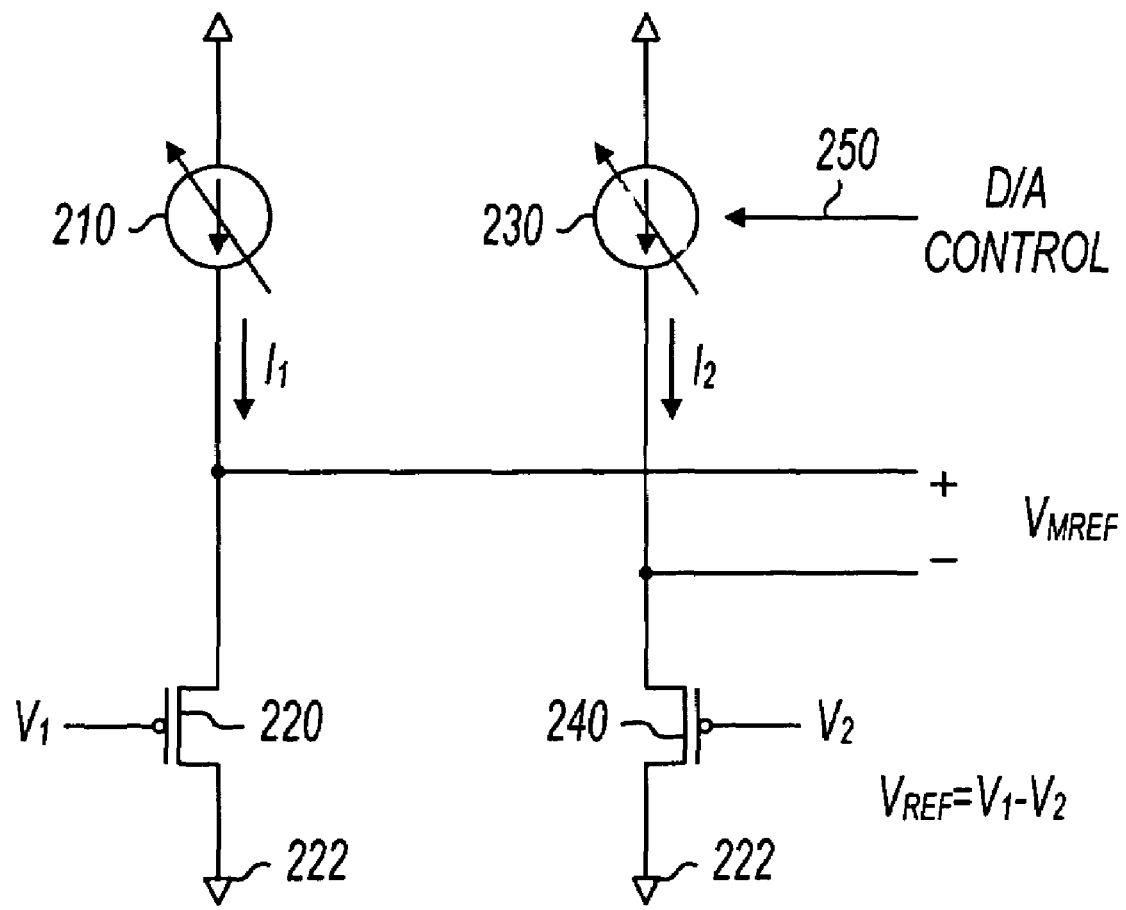
FIGS. 2 and 3 show offset canceling buffers.

FIG. 2 shows an offset canceling buffer. Offset canceling buffer 200 includes digitally controllable current sources 210 and 230, and transistors 220 and 240. Transistor 220 is coupled source-to-drain between current source 210 and reference node 222, and transistor 240 is coupled source-to-drain between current source 230 and reference node 222. Transistor 220 receives a gate voltage $V_1$, and Transistor 240 receives a gate voltage $V_2$, where $V_{REF}=V_1-V_2$. A differential $V_{MREF}$ is produced as the difference between the source voltages on transistors 220 and 240. As shown in FIG. 2, transistors 220 and 240 may be P-type Metal Oxide Semiconductor Field Effect Transistors (PMOSFET). In these embodiments, "body effect" can be reduced by coupling the body of the transistor to the source node of the transistor. In other embodiments, transistors other than PMOSFETs are utilized.

Digitally controllable current source 210 provides current $I_1$ to the source terminal of transistor 220, and digitally controllable current source 230 provides current $I_2$ to the source terminal of transistor 230. $I_1$ and $I_2$ vary in response to the control information provided at 250. In some embodiments, the sum of $I_1$ and $I_2$ remains constant as they individually vary. In these embodiments, controllable current sources 210 and 230 may be considered as a single current source that switches current between the two current paths.

When currents provided by digitally controlled current sources 210 and 230 are substantially equal, $V_{MREF}$ is substantially equal to $V_1$-$V_2$. However, when the currents are unequal, the gate-to-source voltage ($V_{GS}$) of transistors 220 and 240 change, and $V_{MREF}$ is equal to $V_1$ minus $V_2$ plus the difference between $V_{GS}$ of transistor 220 and $V_{GS}$ of transistor 240. By modifying $I_1$ and $I_2$, $V_{MREF}$ can be modified to provide offset canceling as described above with reference to FIG. 1.

In some embodiments, additional transistors are included source-to-drain between transistors 220 and 240 and reference node 222. For example, cascode transistors may be included as described below with reference to FIG. 3.

Figure 3:
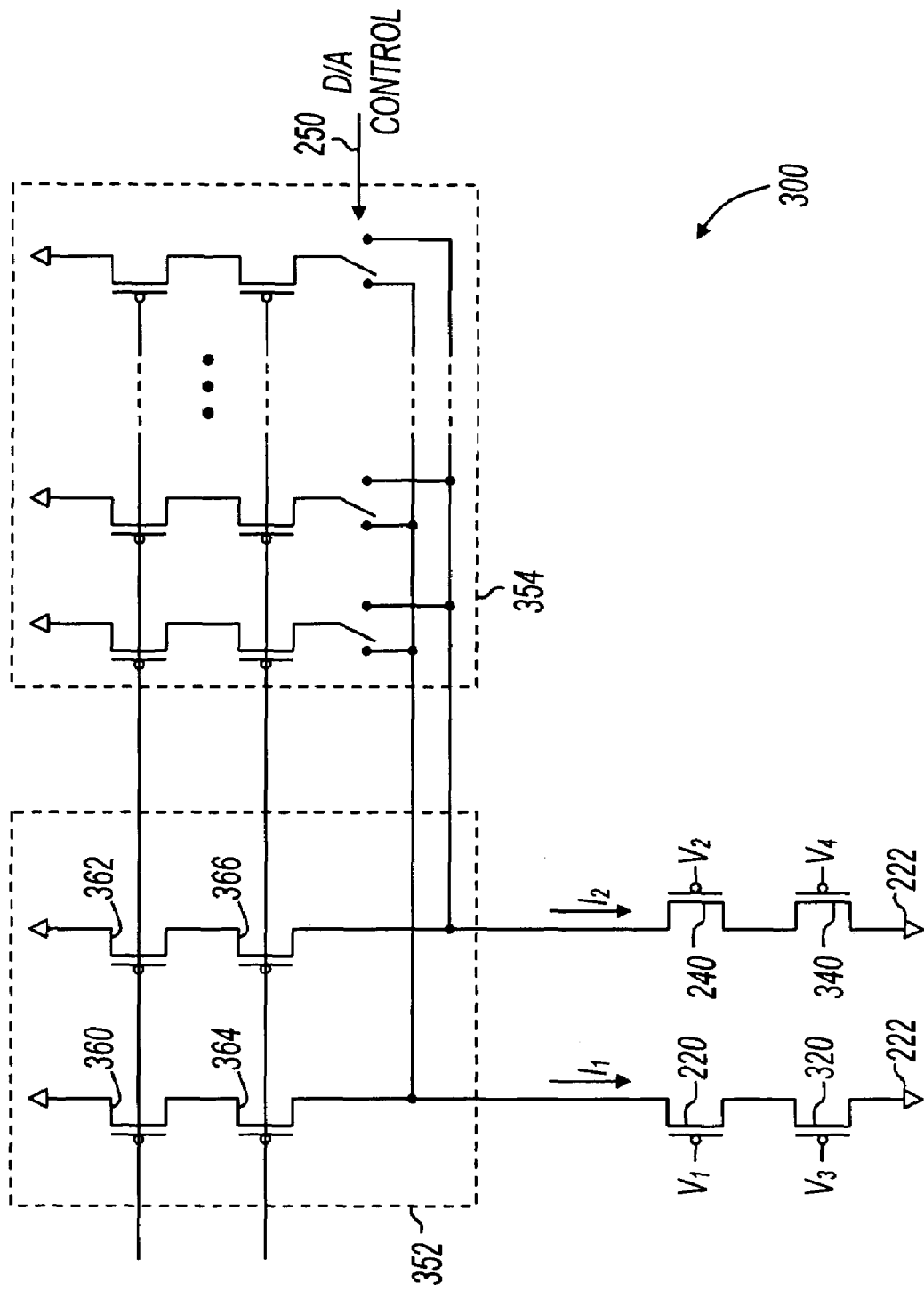
Figure 5:
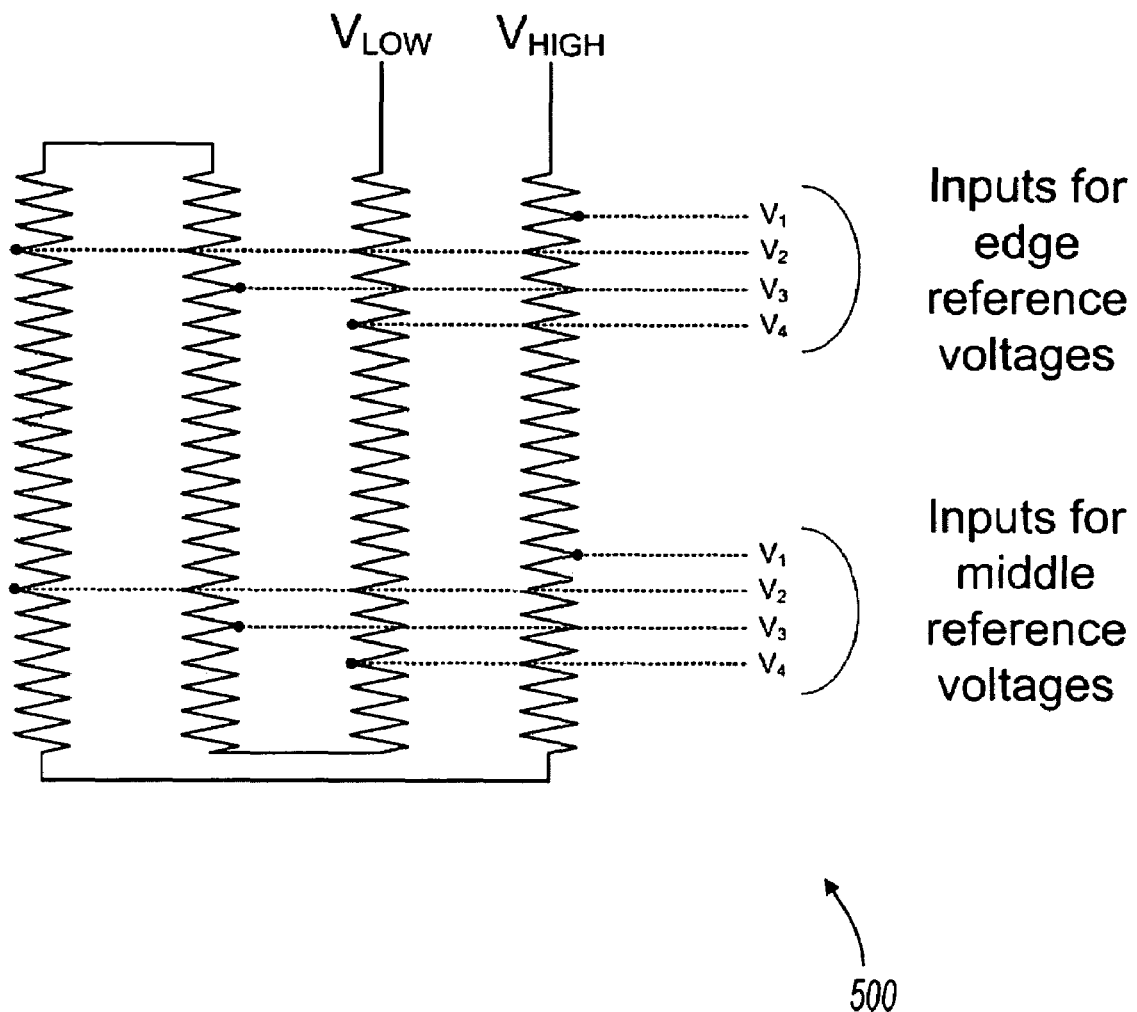
FIG. 5 shows a reference voltage generation circuit.

FIG. 3 shows an offset canceling buffer. Offset canceling buffer 300 may be used in a comparator circuit such as comparator circuit 100 (FIG. 1) to cancel the offset of a comparator. Offset canceling buffer 300 includes transistors 220, 240, 320, and 340, and a digitally programmable current source that includes fixed portion 352 and variable portion 354. Transistors 220 and 240 are described above with reference to FIG. 2. Transistors 320 and 340 are provided to reduce the effect of the finite output impedance of transistors 220 and 240. Transistor 320 receives a gate voltage $V_3$ and transistor 340 receives a gate voltage $V_4$. As shown in FIG. 5, $V_1$, $V_2$, $V_3$, and $V_4$ are chosen such that $V_1$-$V_3$ is substantially equal to $V_2$-$V_4$. This maintains the drain-to-source voltage ($V_{DS}$) of transistors 220 and 240 substantially equal for any value of $V_{REF}$, and reduces variations in $V_{MREF}$ as $I_1$ and $I_2$ vary.

The digitally controllable current source functions as a digital-to-analog converter that steers current as a function of a digital word. Fixed portion 352 includes current mirror transistors 360 and 362, and cascode transistors 364 and 366. Current mirror transistors 360 and 362 receive a gate voltage $V_{BIAS}$ from a bias circuit (not shown), and the fixed currents provided by current mirror transistors 360 and 362 are determined by $V_{BIAS}$. Current mirror transistor 360 provides a fixed current in a first current path to transistor 220, and current mirror transistor 362 provides a second fixed current in a second current path to transistor 240. Variable portion 354 includes a plurality of current mirror transistors that can be switched between the two current paths by operation of the digital control word provided at 250. In embodiments represented by FIG. 3, the sum of $I_1$ and $I_2$ is substantially constant, and is equal to the total current provided by the digitally controllable current source.

Offset canceling buffer 300 may be calibrated to cancel the offset of an analog comparator. During calibration, $V_1$ and $V_2$ are set to the same value, $V_3$ and $V_4$ are set to some other same value, and the digital control word is set to steer most current to one of the two current paths ($I_1$, $I_2$). The digital word is then modified in single bit steps until the comparator's digital output changes (i.e., the comparator offset is minimized). The digital control word that causes the state change is saved to cancel the comparator offset during normal operation. In some embodiments, the calibration is performed at high speeds so that the calibration corrects both static and dynamic offsets.

The switches shown in FIG. 3 represent switching elements that may be implemented using any suitable circuit element(s). For example, in some embodiments, one or more switches are implemented using isolated gate transistors such as metal oxide semiconductor field effect transistors (MOSFET).

Figure 4:
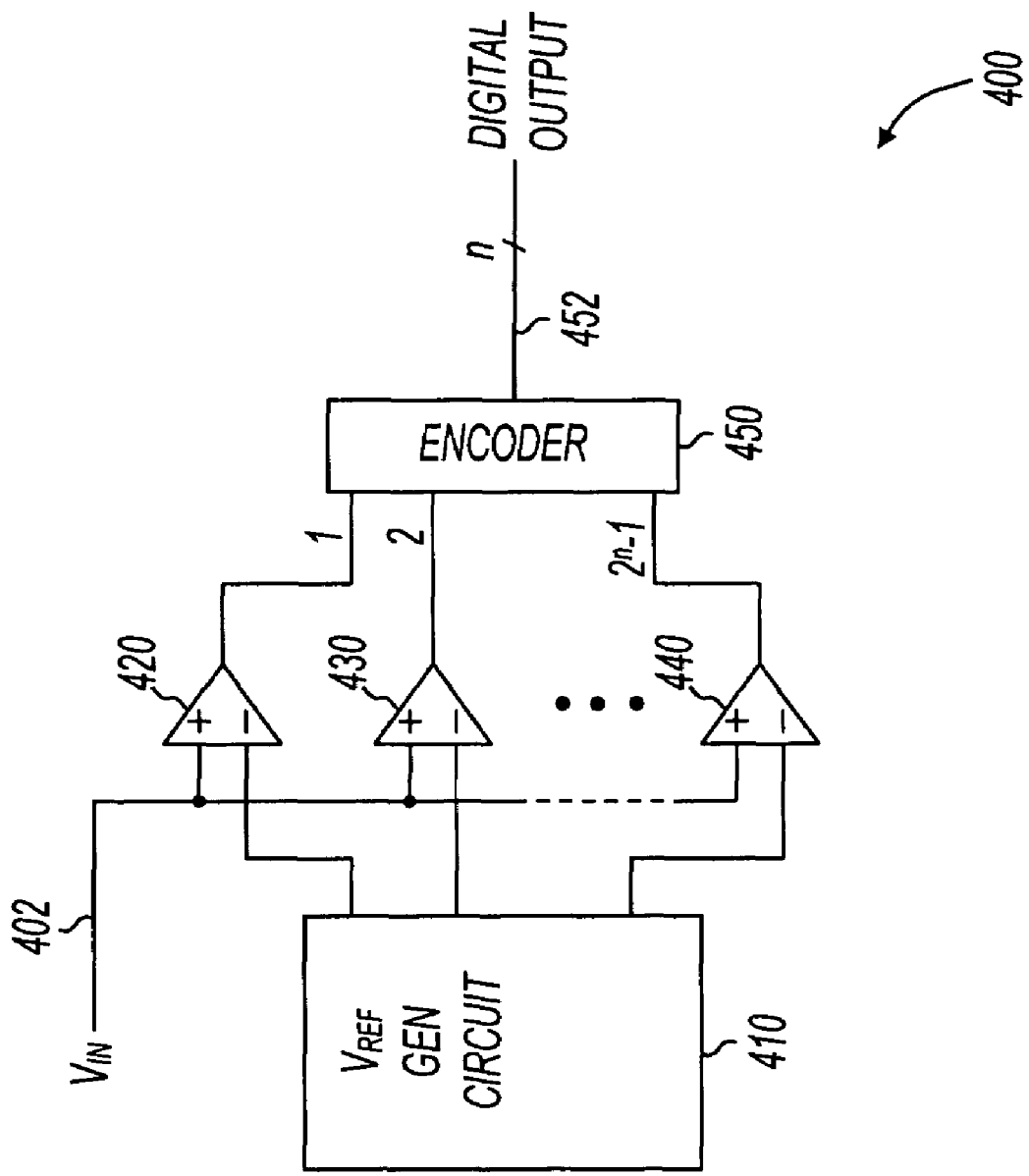
FIG. 4 shows an analog-to-digital converter circuit.

FIG. 4 shows an analog-to-digital converter (ADC) circuit. ADC 400 includes reference voltage generator circuit 410, comparator circuits 420, 430, and 440, and encoder circuit 450. In operation, ADC 400 receives an input voltage ($V_{IN}$) on node 402 and produces an n-bit wide digital result on node 452. ADC circuit 400 includes $2^n-1$ comparator circuits, three of which are shown in FIG. 4. Encoder circuit 450 receives digital outputs from the $2^n-1$ comparator circuits and encodes the output in the n-bit output word. Encoder 450 may provide a binary-coded output, a Gray-coded output, or any other suitably encoded output.

Each of the comparator circuits shown in FIG. 4 include an offset canceling buffer such as offset canceling buffers 180 (FIG. 1), 200 (FIG. 2), or 300 (FIG. 3). Each comparator circuit may undergo calibration to determine an offset setting to compensate for offset within that particular comparator circuit.

Reference voltage generation circuit 410 provides reference voltages to the comparators in ADC 400. Each comparator circuit may be provided with more than one actual voltage value. For example, in embodiments that utilize offset canceling buffer 200 (FIG. 2), each comparator may be provided with two voltage values ($V_1$, $V_2$), and in embodiments that utilize offset canceling buffer 300 (FIG. 3), each comparator may be provided with four voltage values ($V_1$, $V_2$, $V_3$, $V_4$). An example reference voltage generation circuit suitable for use with offset canceling buffer 300 (FIG. 3) is described below with reference to FIG. 5.

FIG. 5 shows a reference voltage generation circuit. Circuit 500 includes a resistor ladder useful to generate four voltage values for each comparator circuit in an analog-to-digital converter. The four voltage values may be provided to offset canceling buffers such as offset canceling buffer 300 (FIG. 3). The arrangement of circuit 500 provides a different $V_{REF}=V_1-V_2$ to each comparator in an ADC, while maintaining $V_1$-$V_3$ substantially equal to $V_2$-$V_4$ as described above with reference to FIG. 3.

Figure 6:
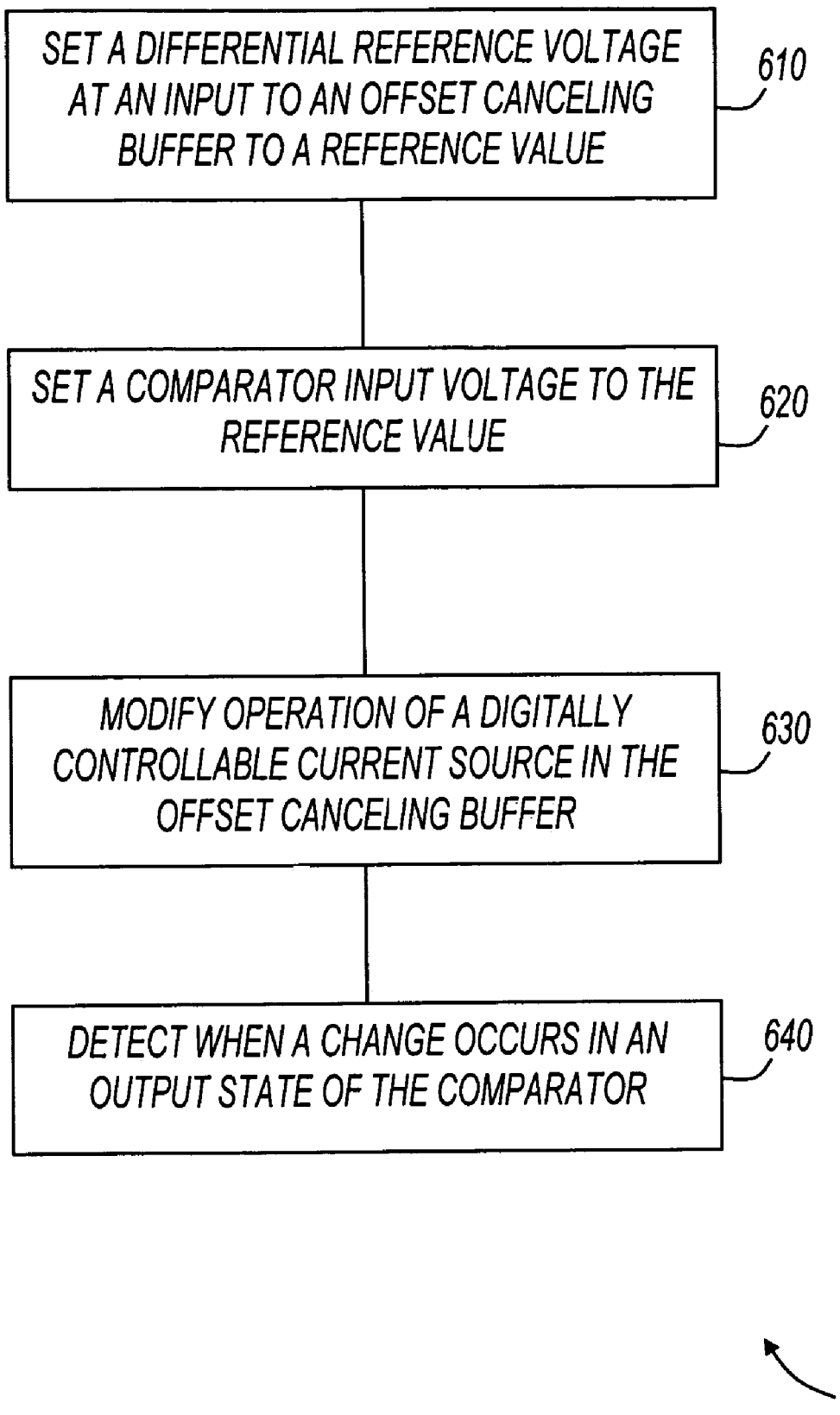
FIG. 6 shows a flowchart.

FIG. 6 shows a flowchart in accordance with various embodiments of the present invention. In some embodiments, method 600 is performed by a comparator circuit such as circuit 100 (FIG. 1). In other embodiments, method 600 is performed by an ADC circuit such as ADC 400 (FIG. 4). Further, in some embodiments, method 600, or portions thereof, is performed by an electronic system or an integrated circuit within an electronic system, embodiments of which are shown in the various figures. Method 600 is not limited by the particular type of apparatus or software element performing the method. The various actions in method 600 may be performed in the order presented, or may be performed in a different order. Further, in some embodiments, some actions listed in FIG. 6 are omitted from method 600.

Method 600 begins at 610 where a differential reference voltage at an input to an offset canceling buffer is set to a reference value. For example, $V_{REF}$ in FIG. 1 may be set to zero volts. Also for example, V1 and V2 (FIGS. 2, 3) may be shorted together to set the differential reference voltage to zero.

At 620, a comparator input voltage is set to the reference value. The acts of 610 and 620 correspond to setting VIN and VREF of FIG. 1 to a common reference value, which in some embodiments is zero. The acts of 610 and 620 may also correspond to setting an ADC input voltage equal to reference voltages provided to multiple comparators. For example, VIN and the multiple reference voltages shown in FIG. 4 may be set to a common voltage value to calibrate offset canceling buffers in each comparator circuit.

At 630, the operation of a digitally controllable current source in the offset canceling buffer is modified. In some embodiments, this corresponds to steering current to one of two paths within the offset canceling buffer. Further, current may be switched from one path to another in steps corresponding the value of one least significant bit of a digital control word. As the current is stepped from one path to another, a modified reference voltage is provided from the offset canceling buffer to a comparator.

At 640, a change in the output state of the comparator is detected. When the output state of the comparator changes, the offset has been determined within the resolution of the offset canceling buffer. The digital word that caused the comparator to change state is saved for use during normal operation of the comparator to cancel any offset in the comparator.

In some embodiments, the actions of method 600 are carried out simultaneously for multiple comparator circuits. For example, in ADC 400 (FIG. 4), each comparator circuit includes an offset canceling buffer that may be calibrated at the same time. Each offset canceling buffer may then be set to provide the appropriate amount of offset cancellation corresponding to any offset determined to exist in the corresponding comparator.

The actions of method 600 may be carried out at a slow speed to allow settling of each circuit node, or may be carried out at a fast speed to determine offsets that exist when the circuit is operating at the fast speed. In some embodiments, the comparator circuits are operated at a speed corresponding to an operational speed, and the offset canceling buffer is modified at a slower speed to allow the modified reference voltage to settle. For example, the comparator circuits may be operated at 5 giga-samples per second, while the modification of the offset canceling buffer may be performed more slowly to ensure adequate settling time.

Figure 7:
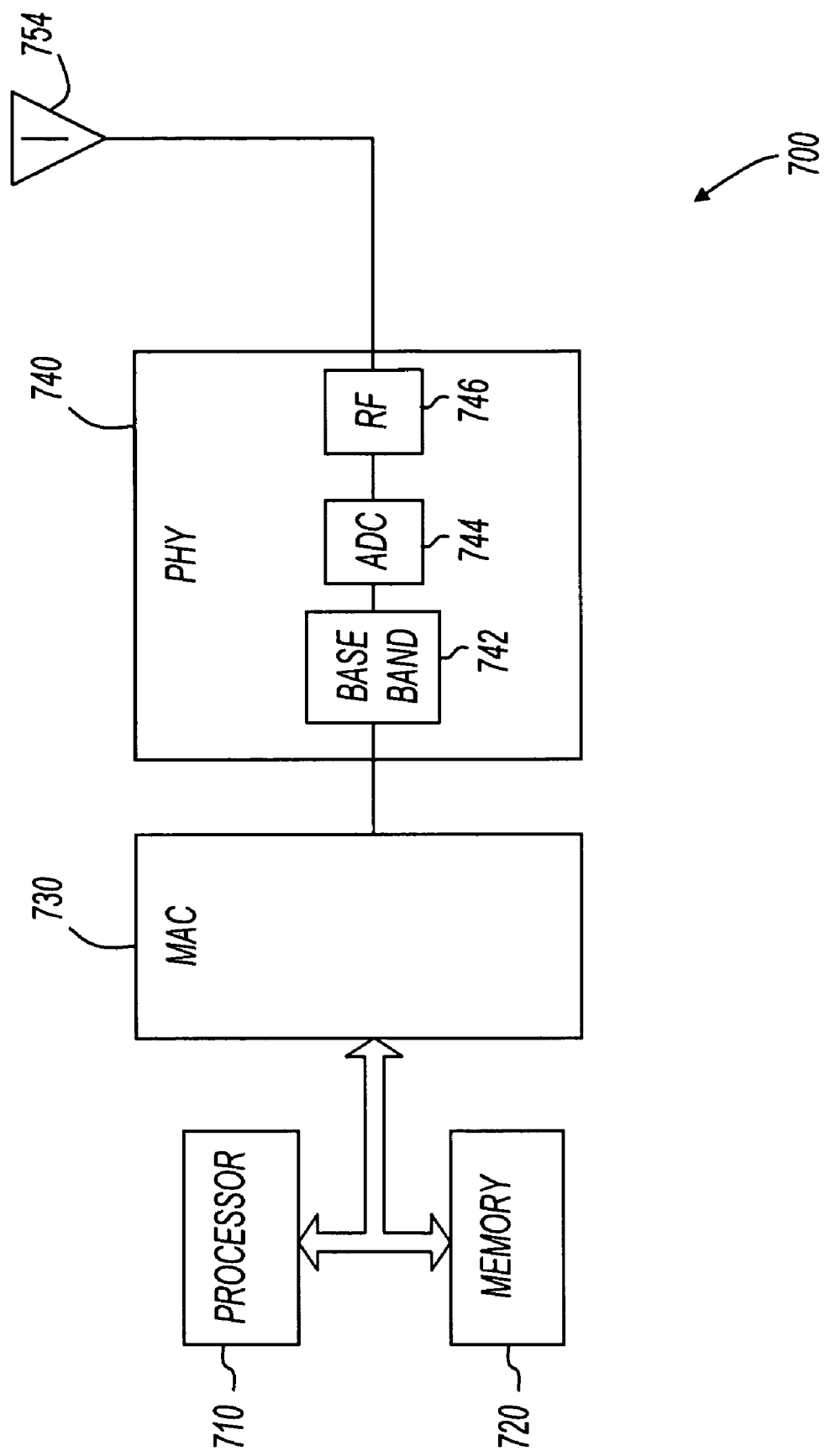
FIG. 7 shows a system diagram.

FIG. 7 shows a system diagram in accordance with various embodiments of the present invention. Electronic system 700 includes antenna 754, physical layer (PHY) 740, media access control (MAC) layer 730, processor 710, and memory 720. In operation, system 700 sends and receives signals using antenna 754, and the signals are processed by the various elements shown in FIG. 7.

Antenna 754 may include one or more antennas. For example, antenna 754 may include a single directional antenna or an omni-directional antenna. As used herein, the term omni-directional antenna refers to any antenna having a substantially uniform pattern in at least one plane. For example, in some embodiments, antenna 754 may include a single omni-directional antenna such as a dipole antenna, or a quarter wave antenna. Also for example, in some embodiments, antenna 754 may include a single directional antenna such as a parabolic dish antenna or a Yagi antenna. In still further embodiments, antenna 754 may include multiple physical antennas. For example, in some embodiments, multiple antennas are utilized for multiple-input-multiple-output (MIMO) processing or spatial-division multiple access (SDMA) processing.

Physical layer (PHY) 740 is coupled to antenna 754 to interact with other wireless devices. PHY 740 may include circuitry to support the transmission and reception of radio frequency (RF) signals. For example, as shown in FIG. 7, PHY 740 includes radio frequency (RF) circuits 746, ADC 744, and baseband circuits 742. ADC circuit 744 may include one or more offset canceling buffers such as those described above with reference to FIGS. 1-6. In some embodiments, RF circuits 746 include additional functional blocks to perform filtering, frequency conversion or the like.

Radio frequency circuits 746 receives signals from antenna 754 and performs additional processing. For example, in some embodiments, RF circuit 746 performs low noise amplification (LNA), frequency down-conversion, demodulation, or other functions. Further, in some embodiments, RF circuit 746 also includes a transmitter, and performs modulation, filtering, frequency up-conversion, amplification, or the like.

Baseband circuit 742 may be any type, of circuit to provide digital baseband processing in a communications system. In some embodiments, baseband circuit 742 includes a processor such as a digital signal processor (DSP), and in other embodiments, baseband circuit 742 is implemented as a system on a chip (SOC) that includes many functional blocks.

PHY 740 may be adapted to transmit/receive and modulate/demodulate signals of various formats and at various frequencies. For example, PHY 740 may be adapted to receive ultra-wideband (UWB) signals, time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 7 include cellular phones, personal digital assistants, wireless local area network interfaces, wireless wide area network stations and subscriber units, and the like. Many other systems uses for ADC circuits with offset canceling buffers exist. For example, ADC 744 may be used in a desktop computer, a network bridge or router, or any other system without an antenna.

Media access control (MAC) layer 730 may be any suitable media access control layer implementation. For example, MAC 730 may be implemented in software, or hardware or any combination thereof. In some embodiments, a portion of MAC 730 may be implemented in hardware, and a portion may be implemented in software that is executed by processor 710. Further, MAC 730 may include a processor separate from processor 710.

Processor 710 may be any type of processor capable of communicating with memory 720, MAC 730, and other functional blocks (not shown). For example, processor 710 may be a microprocessor, digital signal processor (DSP), microcontroller, or the like.

Memory 720 represents an article that includes a machine readable medium. For example, memory 720 represents a random access memory (RAM), dynamic random access memory (DRAM), static random access memory (SRAM), read only memory (ROM), flash memory, or any other type of article that includes a medium readable by processor 710. Memory 720 may store instructions for performing software driven tasks. Memory 720 may also store data associated with the operation of system 700.

Although the various elements of system 700 are shown separate in FIG. 7, embodiments exist that combine the circuitry of processor 710, memory 720, MAC 730, and all or a portion of PHY 740 in a single integrated circuit. For example, baseband circuits 742 and ADC 744 may be combined together on an integrated circuit die. Also for example, ADC 744 and RF circuits 746 may be combined together on an integrated circuit die. In some embodiments, the various elements of system 700 may be separately packaged and mounted on a common circuit board. In other embodiments, the various elements are separate integrated circuit dice packaged together, such as in a multi-chip module, and in still further embodiments, various elements are on the same integrated circuit die.

Analog to digital converters, offset canceling buffers, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of offset canceling buffer 300 (FIG. 3) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A circuit comprising:
   a comparator having a signal input and a reference input;
   an offset canceling buffer coupled to receive a reference voltage, and to provide an offset canceled reference voltage to the reference input of the comparator; and
   a feedback path to modify operation of the offset canceling buffer in response to an output signal provided by the comparator;
   wherein the feedback path comprises a state machine to modify operation of the offset canceling buffer and to detect a change in the output signal provided by the comparator to determine an offset canceling setting for the offset canceling buffer.

2. A circuit comprising:
   a comparator having a signal input and a reference input; and
   an offset canceling buffer coupled to receive a reference voltage, and to provide an offset canceled reference voltage to the reference input of the comparator;
   wherein the offset canceling buffer comprises at least one digitally programmable current source.

3. The circuit of claim 2 wherein the offset canceling buffer further comprises:
   two current paths to accept current from the at least one digitally programmable current source; and
   two transistors coupled source-to-drain in the two current paths, wherein the reference voltage provided by the offset canceling buffer is provided as a differential voltage between the source terminals of the two transistors.

4. The circuit of claim 3 wherein the offset canceling buffer further comprises two more transistors coupled source-to-drain between drain terminals of the two transistors and a reference node.

5. The circuit of claim 4 further comprising a voltage reference generation circuit coupled to provide reference voltages to gate nodes of the two transistors and the two more transistors.

6. The circuit of claim 3 wherein the at least one digitally controlled current source comprises a plurality of current mirror transistors coupled to be switched between the two current paths.

7. An analog to digital converter comprising:
   an input node to receive an input voltage;
   a plurality of comparator circuits coupled to receive the input voltage on the input node; and
   a reference voltage generation circuit to provide reference voltages to each of the plurality of comparator circuits;
   wherein each of the plurality of comparator circuits includes a comparator and an offset canceling buffer to receive corresponding reference voltages from the reference voltage generation circuit, and to provide an offset canceled reference voltage to the comparator.

8. The analog to digital converter of claim 7 wherein the offset canceling buffer comprises:
   a first transistor having a gate node coupled to receive a first reference voltage;
   a second transistor having a gate node coupled to receive a second reference voltage; and
   a digitally programmable current source to switch current between the first and second transistors.

9. The analog to digital converter of claim 8 wherein the offset canceling buffer further comprises:
   a third transistor coupled source-to-drain between the first transistor and a reference node, the third transistor having a gate node coupled to receive a third reference voltage; and
   a fourth transistor coupled source-to-drain between the second transistor and the reference node, the fourth transistor having a gate node coupled to receive a fourth reference voltage;
   wherein a difference between the first and third voltages is substantially equal to a difference between a difference between the second and fourth voltages.

10. The analog to digital converter of claim 9 wherein the reference voltage generation circuit comprises a resistor ladder.

11. The analog to digital converter of claim 8 further comprising feedback paths between comparator outputs and the digitally programmable current sources to modify operation of the digitally programmable current sources in response to comparator outputs.

12. The analog to digital converter of claim 7 further comprising a thermometer encoding circuit coupled to outputs of the plurality of comparator circuits.

13. A method comprising:
   setting a differential reference voltage at an input to an offset canceling buffer to a reference value;

setting a comparator input voltage to the reference value;

modifying operation of a digitally controlled current source in the offset canceling buffer; and detecting when a change occurs in an output state of the comparator.

14. The method of claim 13 further comprising repeating the modifying operation until the change occurs, and storing a current digital word in a register, where the current digital word influences the operation of the digitally controlled current source.

15. The method of claim 13 wherein the reference value is substantially zero volts.

16. The method of claim 13 further comprising repeating the detecting at a maximum operational rate.

17. The method of claim 13 further comprising repeating the detecting operation at a rate greater than 5 GHz.

18. An electronic system comprising:

an antenna; and an integrated circuit to operate on signals received by the antenna, the integrated circuit including an input node to receive an input voltage, a plurality of comparator circuits coupled to receive the input voltage on the input node, and a reference voltage generation circuit to provide reference voltages to each of the plurality of comparator circuits, wherein each of the plurality of comparator circuits includes a comparator and an offset canceling buffer to receive corresponding reference voltages from the reference voltage generation circuit, and to provide an offset canceled reference voltage to the comparator.

19. The electronic system of claim 18 wherein the offset canceling buffer comprises:

a first transistor having a gate node coupled to receive a first reference voltage;

a second transistor having a gate node coupled to receive a second reference voltage; and a digitally programmable current source to switch current between the first and second transistors.

20. The electronic system of claim 19 wherein the offset canceling buffer further comprises:

a third transistor coupled source-to-drain between the first transistor and a reference node, the third transistor having a gate node coupled to receive a third reference voltage; and a fourth transistor coupled source-to-drain between the second transistor and the reference node, the fourth transistor having a gate node coupled to receive a fourth reference voltage;

wherein a difference between the first and third voltages is substantially equal to a difference between a difference between the second and fourth voltages.

* * * * *